United States Patent [19]
Modgil et al.

[11] Patent Number: 5,352,986
[45] Date of Patent: Oct. 4, 1994

[54] CLOSED LOOP POWER CONTROLLER

[75] Inventors: Onkar S. Modgil, Mesquite; Robert G. Nelson; Margaret S. Reif, both of Dallas, all of Tex.

[73] Assignee: Digital Fidelity, Inc., Plano, Tex.

[21] Appl. No.: 7,521

[22] Filed: Jan. 22, 1993

[51] Int. Cl.⁵ .................. H03F 3/38; H03F 1/36
[52] U.S. Cl. ......................... 330/10; 330/107
[58] Field of Search ............ 330/10, 207 A, 251, 330/107, 109

[56] References Cited

U.S. PATENT DOCUMENTS 4,724,396  2/1988  Taylor et al. ............. 330/10
5,218,315  6/1993  Turner ...................... 330/10

*Primary Examiner*—Steven Mottola
*Attorney, Agent, or Firm*—W. J. Scherback

[57] ABSTRACT

A power controller includes a closed-loop system having a summer to sum an input signal with a derived output signal to produce a difference signal. A comparator compares the difference signal with a reference signal to produce a digital signal representative of the polarity difference between the difference signal and the reference signal. Two switching networks respond to the digital signal to produce high energy outputs representative of the digital signal which are used to reduce the level of the difference signal in a frequency band of interest at the comparator. A low pass filter between the high energy outputs and the comparator attenuates high-frequency noise. A low-pass filter of at least the third order, connected in the closed loop, enhances the signal-to-noise ratio. In a specific application the power controller is a power amplifier and the input signal is in the audio frequency range.

22 Claims, 8 Drawing Sheets

CLOSED LOOP POWER CONTROLLER

BACKGROUND OF THE INVENTION

1. Field of the Invention

This invention relates to systems for controlling the power applied to a load. The load may be resistance or reactive. Applications of the invention include audio amplifiers and motor controllers.

2. Discussion of the Prior Art

Power controlling systems have wide spread utility. One of the more extensive uses is in power amplifiers, particularly audio amplifiers. Traditionally, power controllers utilized linear techniques such as class A amplifiers, class B amplifiers, and class AB amplifiers. The major drawback of these amplifiers has been low efficiency. The greatest theoretical efficiency of a linear amplifier is 78.5 per cent for a class B amplifier, but as a practical matter, the best linear amplifiers can only obtain 50 per cent efficiency and usually operate with about 30 per cent efficiency. Low efficiency means that, in order to obtain an output of a load of 30 watts, it is necessary to provide a driving power source of at least 100 watts. This means 70 watts of power is dissipated, principally in the form of heat, by the power controller. The greater the need for power, such as audio power, the greater the need for proper ventilation, the greater the need for heat sinks to dissipate that heat, and the greater the need for more expensive components that can withstand the power, as heat, being dissipated in those components.

The foregoing becomes a problem, for example, in the installation of audio power amplifiers in automobiles. Installation of high power audio amplifiers in the dashboards of automobiles becomes a problem due to a lack of ventilation and a lack of room for large heat sinks. Therefore, manufacturers find it necessary to install the power amplifiers in the trunks of automobiles, installing only the tuner, preamplifier, cassette player, etc. in the dashboard. Accordingly, there is a need for a light weight, high-efficiency audio power amplifier for use in automobiles, an amplifier that can be installed entirely in the dashboard of the automobile along with the radio.

Other advantages of high efficiency include a reduction in the cost of building the power controller, since the heat sinks can be reduced in size and weight, since the electronic components such as transistors can be replaced with lower powered devices, and since the power demand on the power source for the power controller can be reduced.

A variety of non-linear techniques have been utilized to greatly increase the efficiency of power controllers, such as audio amplifiers. These amplifiers take on many forms utilizing modulation techniques. For example, U.S. Pat. No. 4,178,556 discloses a class D amplifier system including a pulse width modulator and U.S. Pat. No. 4,500,844 discloses a switching amplifier utilizing delta-modulation techniques. These power controlling techniques achieve high efficiency by utilizing power controlling devices such as transistors that operate as switches instead of linearly. A transistor operating as a switch dissipates no power when it is off and dissipates very little heat when it is on because of its low on-resistance and low voltage drop across the device.

These power controllers which utilize modulation or switching techniques have analog outputs which have limited linearities and limited signal-to-noise ratios. One method to increase the linearly or signal-to-noise ratio is to increase the frequency of the modulation or switching. There is a practical limit to higher frequency switching because of the limitation of the switching speed of the power switching devices, typically transistors. Another method is to improve the low-pass filter that is used to attenuate the error components outside the band of interest. Traditionally, the limit on the low-pass filter is a second order filter, because a higher order filter will cause instability in a closed loop system.

The present invention includes the use of a third or higher order filter in the closed loop, where the use of such a filter greatly enhances the signal-to-noise ratio and linearity of the analog output. Stability is improved by the use of a filter design which is normally undesirable in that it is underdamped. Underdamped means that the output is inclined to oscillate when stimulated by an impulse or step function at its input. Such underdamped filters have unusual gain and phase responses that are normally considered undesirable, and hence, designers normally will not use them. The only other practical application that uncovered of such a filter is described in U.S. Pat. No. 4,509,037 which covers the invention of an Enhanced Delta Modulation Encoder. This invention describes an analog-to-digital converter which creates a single bit digital data stream representative of the analog signal being measured.

In view of the foregoing, it is an object of the present invention to provide a high-efficiency, power controller with the efficiency being of the order of 90 percent.

It is another object of the present invention to provide a power controller having a high signal-to-noise ratio and high linearity.

SUMMARY OF THE INVENTION

In accordance with the present invention, there is provided a closed-loop system, including an analog input and an analog output. A signal applied to the input is summed with a signal derived from the analog output to produce a difference signal representative of the polarity of the difference between the input signal and the derived output signal. A digital signal is representative of the polarity of the difference signal. The system includes at least two (2) switching networks, having high energy outputs, and which are responsive to the digital signals to reduce the levels of the difference signal in a frequency band of interest at the source of the digital signals. A low-pass filter is included between the high energy outputs and the analog output to attenuate high frequency noise.

In one embodiment the switching networks are responsive to the digital signals synchronous with a clock producing pulses and at a rate significantly higher than the frequency of the input signal.

In a preferred embodiment there is included a low-pass filter, at least of the third order, to enhance the signal-to-noise ratio of the closed-loop system. The preferred embodiment of the invention includes a comparison means for comparing the difference signal with a reference signal to produce the digital signal representative of the polarity difference between the difference signal and the reference signal. Present in the loop are two (2) low-pass filters; one of which is a passive filter to attenuate high frequency noise, and the other is an active filter, at least of the third order, to enhance the signal-to-noise ratio. Preferably, the active filter is underdamped.

DETAILED DESCRIPTION

Figure 1:
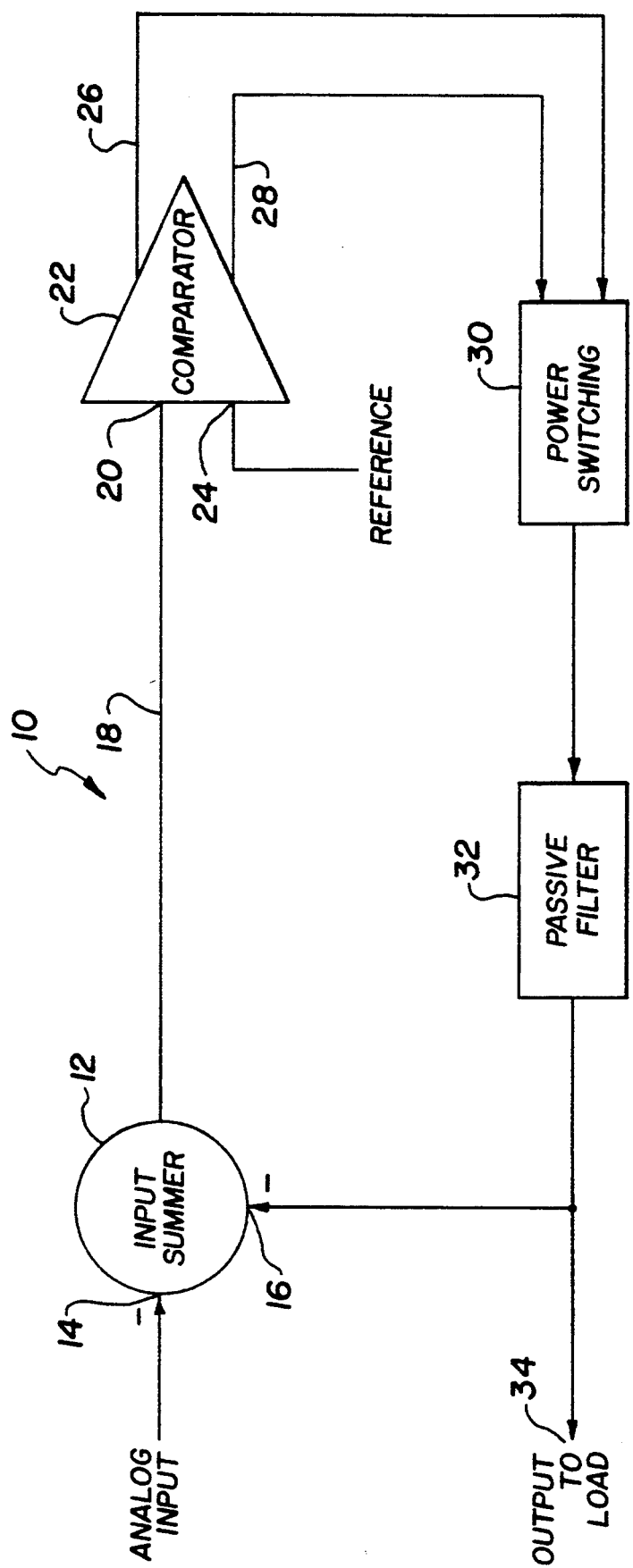
FIG. 1 a block diagram of a power controller of the present invention.

Referring now to FIG. 1, there is illustrated one embodiment of the present invention, a power controller 10. An input summer 12 has a first input 14 to which is applied an analog input signal and a second input 16 is applied a signal which is an amplified inverted reproduction of the analog input derived from the output of controller 10. The two signals are summed together to create an error signal that represents the difference between the two signals. Should the output signal be in phase with the input signal, then the output signal be in phase with the input signal to create the error signal. The error signal is applied by way of conductor 18 to one input 20 of a comparator 22 where the error signal is compared with a reference signal applied to input 24 of the comparator 22. Should the error signal be greater than the reference signal, the minus control of the comparator on conductor 26 goes low and the plus control of the comparator 22 on conductor 28 goes high. Should the error signal be of lower value than the reference or threshold voltage, then the minus control of the comparator will go high and the plus control of the comparator will go low. The minus control and plus control outputs of the comparator 22 are applied to, and control the operation of a power switching network 30. In the event that the error signal is greater than the reference or threshold voltage applied to input 24 of the comparator 22, the plus control will go high and turn on the power switching device 30 to cause the output of the power switching network to become more positive. In the event that the error signal is less than the reference or threshold voltage, the minus control will increase and turn on the power switching network 30 to cause the output of the network to become more negative.

The output of the power switching network 30 is applied to a low-pass passive filter 32, the filtered output of which is applied as an output to a load, either resistive or reactive, and also applied to input 16 of summer 12. Where the analog input is greater than the output fed back to input 16 of the summer 12, the error signal goes more positive, to correct the original error.

The process continues at a high rate where adjustments are made by power switching network 30, and produces an output that tracks the analog input to reduce the difference called the error signal. This difference is kept to a minimum by the operation of the power switching network. By use of the switching means, the analog input signal is faithfully reproduced as an amplified signal applied to the load 34.

Figure 3:
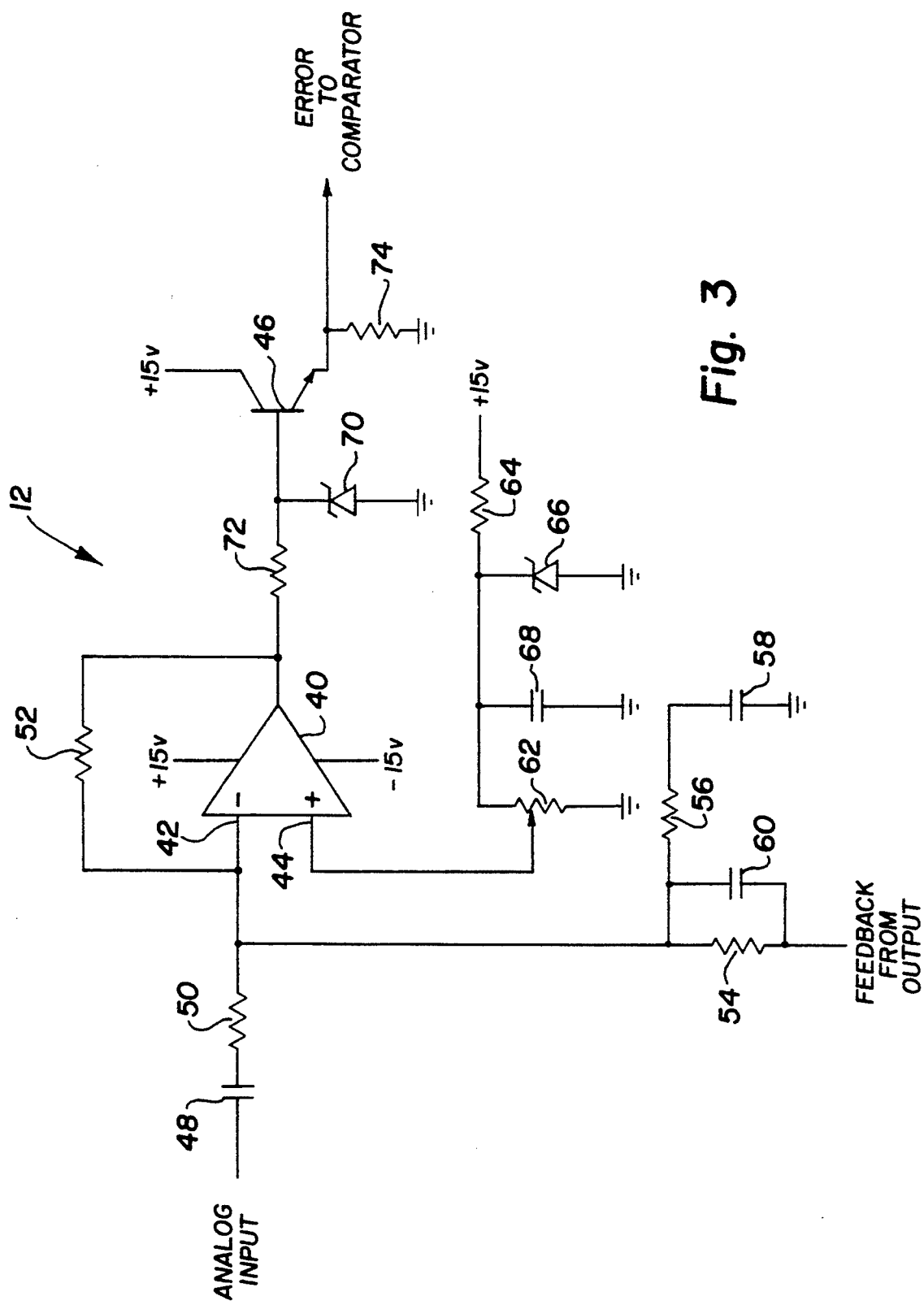
FIG. 3 is a circuit schematic of the input summer of FIG. 1.

Details of the input summer 12 of FIG. 1 are illustrated by the circuit in FIG. 3 to include an operational amplifier 40, which sums the analog input with the feed back from the output at the amplifier's inverting input 42 with a DC offset signal applied to the non-inverting input 44. The output of the amplifier 40 is buffered by a transistor 46, to provide the error signal to be applied to the comparator 22 (FIG. 1). Capacitor 48 is present to remove any unwanted DC component of the analog input. If the D.C. component is desired, the capacitor 48 would be eliminated. The ratio of resistors 50 and 52 set the gain for the analog input signal. The feedback signal from the output is attenuated by the resistors 54 and 56 in the frequency band of interest. At very low frequencies, for example below 5 Hertz, capacitor 58 causes an increased gain in the feedback signal to facilitate the maintenance of a minimal DC offset. Capacitor 60 causes a boost in the high frequency components of the feedback signal, outside of the frequency band of interest, and thereby maintains stability of the closed loop system. The network comprised of resistor 54, resistor 56, and capacitors 58 and 60, together with the amplifier feedback resistor 52, set the gain for the output feedback signal applied to the inverted input 42 of operational amplifier 40.

Resistor network comprised of resistors 62 and 64, together with Zener diode 66, bias the operational amplifier 40, such that the error voltage or signal applied to the comparator is possessed of negligible error with respect to the comparator reference voltage when the output signal is at a near zero DC offset voltage. Capacitor 68 functions to filter out power supply noise. It will be noted that the operational amplifier 40 inverts the sum of the analog input signal and the feedback signal from the output, but does not invert the DC bias signal applied to the non-inverting input 44. In as much as the feedback signal from the output is inverted with respect to the analog input signal, the error signal will be a small difference of one signal canceling the other, plus a DC bias. Diode 70 is present to clip the error signal from the operational amplifier 40 should the signal go too high or too low, the thus protect the voltage comparator from abnormal voltage swings at its input. Resistor 72 isolates the operational amplifier 40 from excessive load when clipping occurs through diode 70. The error signal applied to the base of transistor 46 is converted from a high impedance signal to a low impedance signal by the transistor 46 and resistor 74. This low impedance error signal is then applied to the voltage comparator.

Figure 4:
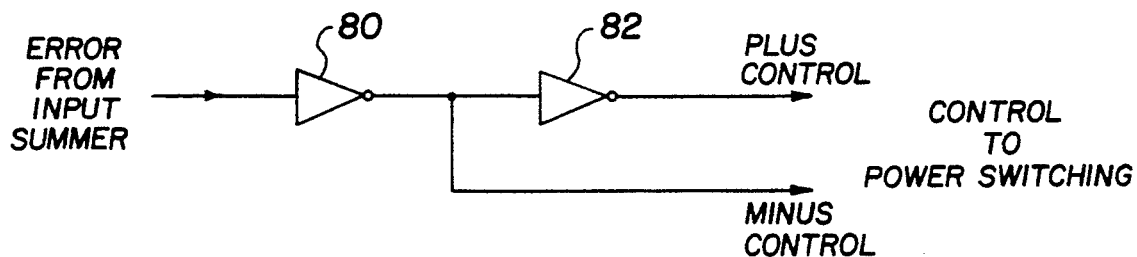
FIG. 4 is a circuit schematic of an asynchronous comparator.

Either a synchronous or an asynchronous comparator may be utilized in the practice of the present invention. An asynchronous comparator is illustrated in FIG. 4, comprised of two (2) inverting gates 80 and 82. The output of gate 80 is the minus control and the output of gate 82 is the plus control. This asynchronous voltage comparator will change states every time the error voltage changes polarity with respect to the voltage comparator reference voltage. Suitable inverting gates are available as part number 74HC04, from Texas Instruments.

Figure 7:
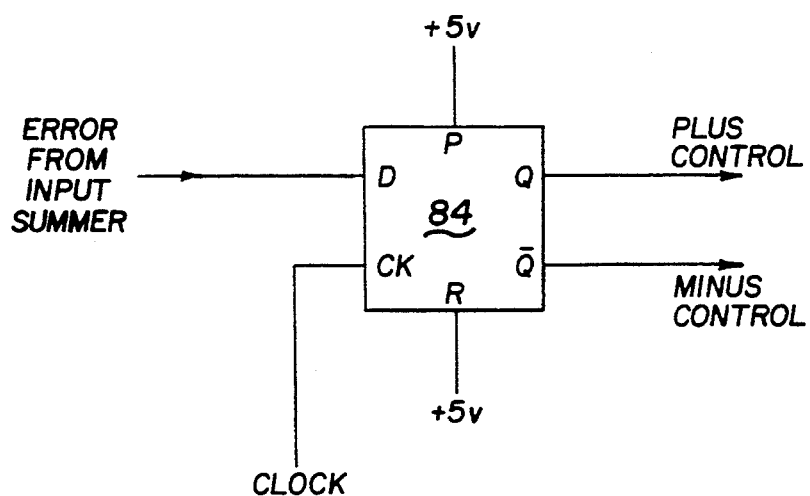
FIG. 7 is a circuit schematic of a synchronous comparator.

A suitable synchronous voltage comparator is illustrated in FIG. 7 to include a D flip-flop 84. The error signal is applied to the D input. The reference or threshold voltage is about one-half of the power supply voltage applied to the gates and this reference voltage is the gate switching threshold voltage. A gate's switching threshold voltage does not utilize a physical voltage reference, but it is inherent in the design of the gate, for example, a high-speed CMOS gate. A high frequency clock signal, typically 50 to 500 times the frequency of the highest frequency of interest in the analog input is applied to the clock input CK of the D flip-flop 84. The highest frequency of interest for high-fidelity audio is typically 20,000 Hertz. The pre-set and re-set inputs, respectively P and R are connected to the power supply, in this case a positive 5 volts, to disable their operation. When the error signal is greater than the reference or threshold voltage, the Q output becomes positive or high, immediately following the positive going transition of the clock pulse, and the inverted Q of output becomes zero or low. When the error signal is less than the reference or threshold voltage, the Q output becomes zero or low immediately following the positive going transition of the clock pulse and the inverted Q output becomes positive or high. A suitable D flip-flop is available from Texas Instruments as part number 74HC74.

Figure 5:
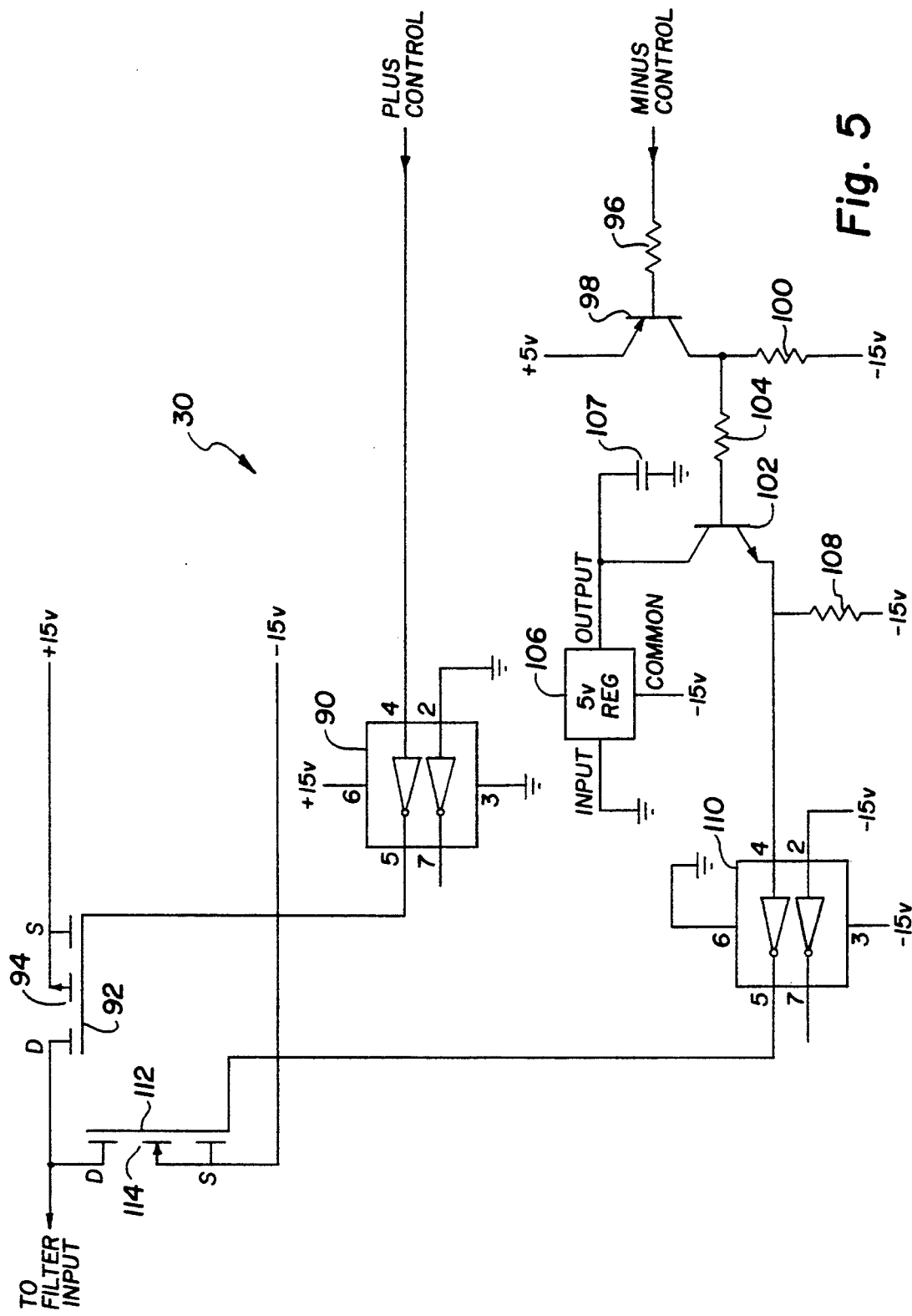
FIG. 5 is a circuit schematic of a suitable power switching network.

The two comparator outputs, plus control and minus control, derived from either of the comparators illustrated in FIG. 4 or FIG. 7 control the operation of the power switching network 30, the details of which are illustrated in FIG. 5. The plus control is applied to one input, pin 4 of a digital drive 90, which is a logic device available from National Semiconductor as part number DS0026. The digital drive 90 applies an inverted logic signal from its output, pin 5, to a gate 92 of a Mosfet transistor 94. In the present embodiment the other half of the digital drive 90, represented by pins 2 and 7 is not used. But, pin 2 is grounded. The source pin S of the Mosfet transistor 94 is connected, for example, to a plus fifteen volt supply. The value of the supply voltage determines the power rating of the amplifier or power controller. The drain pin D of the Mosfet transistor 94 is connected to the filter input.

The minus control is connected to a current limiting resistor 96 to the base of transistor 98. By connecting the emitter of the transistor 98 to a plus five volt supply and the collector of the transistor 98 to a minus fifteen volt supply, through resistor 100, the logic signal minus control is converted to an inverted signal operating between plus five volts and minus fifteen volts. This inverted logic signal then drives the base of transistor 102 through current limiting resistor 104. A positive five volt voltage regulator 106 is connected between ground and minus fifteen volts such that it's output will be five (5) volts more positive than minus fifteen volts. Capacitor 107 is a filter. The collector of transistor 102 is connected to the output of voltage regulator 106, and the transistor emitter is connected to minus fifteen volts through resistor 108. When the base of transistor 102 is driven by the inverted logic signal derived from the minus control, the transistor's emitter will vary from minus fifteen volts to minus ten volts. This varying voltage from the transistor 102 is applied to input pin 4 of a digital driven 110. The digital driver 110 has the same part designation as the digital drive 90. A ground connection to pin 6 of the digital driver 110 is utilized as the positive supply for the driver. Pin 3 of the digital driver 110 is connected to minus fifteen volts as a negative supply. The inverted logic signal occurring at pin 5 of the digital driver 110 is applied to gate 112 of Mosfet transistor 114. As in the case with digital driver 90, only one-half of the digital driver 110 is utilized. Pins 2 and 7 are not used, although pin 2 is connected to a minus fifteen (−15) volt supply. The source pin S of the Mosfet transistor 114 is connected to a minus fifteen volt supply, and the Mosfet transistor drain, pin D is connected to the filter input.

The plus control and minus control will not both be high or positive at the same time, except for possibly for a very short switching transition period. When the plus control goes high, the input to digital driver 90 goes high, and its output goes low, causing Mosfet transistor 94 to turn on, and provide a very low impedance path, such that when the Mosfet transistor 94 is on, the output to the filter input will be a plus fifteen volts. Mosfet transistor 114 will be turned off at this time. When the minus control goes high, transistor 98 will be turned off, and its collector will go to minus fifteen volts. As a result, transistor 102 will be biased off, and it's emitter will go to minus fifteen volts. Output of digital driver 110 will now go high, causing Mosfet transistor 114 to provide a very low impedance path. As a result, a full minus fifteen volts will be applied to the filter input. When the minus control is low, the transistor 98 will be on, with it's collector voltage near plus five volts. Transistor 102 will be on, causing it's emitter to be near minus ten volts. This minus ten volts signals is seen as a logic high by digital driver 110 and it's output at pin 5 will be low, minus fifteen volts, causing Mosfet transistor 114 to turn off. The Mosfet transistors 94 and 114 are selected for high switching speeds and for providing very low impedance or resistance paths, typically less than one ohm. When the plus control is high, the output applied to the filter input will be high or a plus fifteen volts. When the minus control is high, the output applied to the filter input will be low, for example minus fifteen volts. The circuit is designed to prevent both output switching transistors, namely the Mosfet transistors 94 and 114, from being on at the same time.

In normal operation, pulses from the power switching network 30 will vary at a high frequency, between plus and minus fifteen volts, with an average value that is proportional to the analog input signal.

Figure 6:
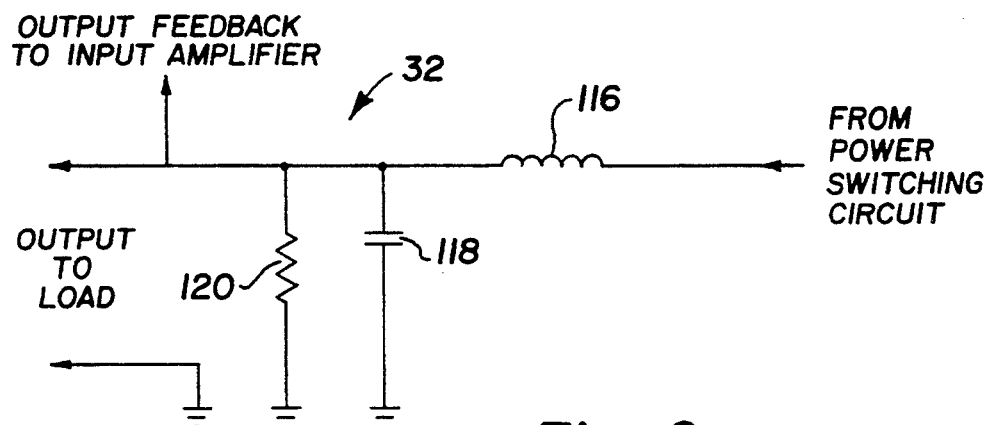
FIG. 6 is a circuit schematic of a passive filter useful in the practice of the present invention.

The output of switching network 30 is applied to a low-pass filter, illustrated in FIG. 6. The low-pass filter 32 is a passive filter, comprised of inductor 116 and capacitor 118. The values of inductor 116 and capacitor 118 are chosen to provide a filter cut-off above the highest frequency to be amplified, but well below any switching frequency. Resistor 120 is a bleeder resistor that drains the capacitor 118 under no-load conditions. The load itself can be resistive, or perhaps somewhat reactive, and of low impedance, such as 4 ohms. A common load would be a speaker voice coil. The passive low-pass filter 32 will attenuate any high frequency switching noise generated by the power switching network 30, and will produce an output that is a relatively noise-free analog signal proportional to the analog input signal. The principal purpose of the filter 32 is to satisfy FCC regulations regarding radiation of high-frequency noise, which otherwise could result if the conductive to the load are very long and unshielded.

Figure 2:
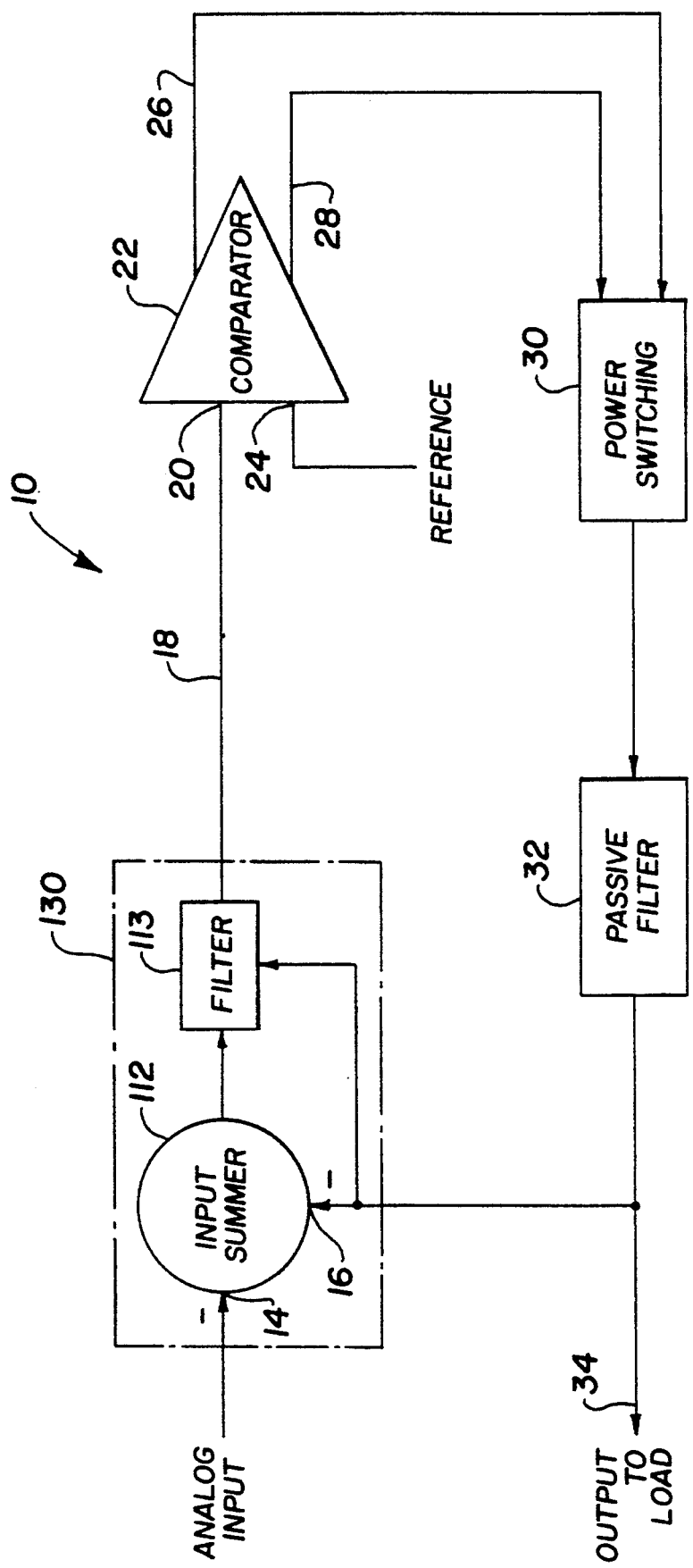
FIG. 2 is a block diagram of a modification of the present invention illustrating the presence of an active filter and a passive filter.

The difference between the analog switch at the input and the analog signal at the output is an error signal that can be viewed as broad band coherent noise with the frequency of the noise extending to one-half the clock frequency. Should it be desired to reduce the coherent noise in the band of interest, for example, up to 20,000 hertz, the error signal must be filtered before it arrives at the voltage comparator, so that the voltage comparator will make better decisions based upon the error signal below 20,000 hertz, and be less influenced by errors above 20,000 hertz and the signal-to-noise ratio will be significantly increased below 20,000 hertz. One manner of accomplishing this is to make the passive filter a higher order filter. Alternatively, as shown in FIG. 2, the higher order filter may be provided by the components within block 130. These components include the input summer 112, together with filter 113.

Figure 8:
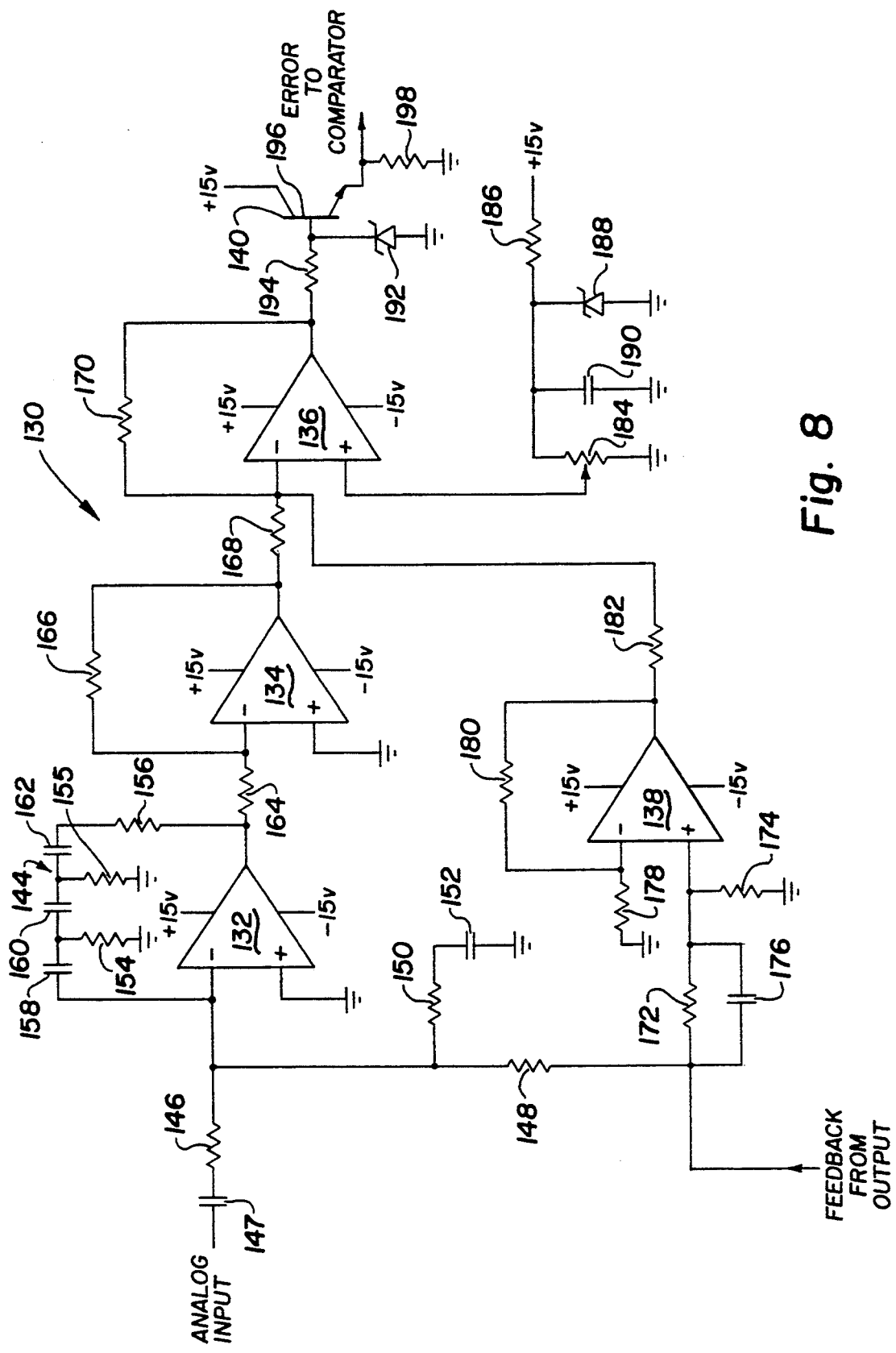
FIG. 8 is a circuit schematic of the input summer of FIG. 2, including an active filter of at least the third order.

Details of the block 130 are illustrated in the circuit schematic of FIG. 8, which provides at least a third order low-pass filter, preferably under-damped, to improve the output signal's signal-to-noise ratio and linearity. The circuit of FIG. 8 comprises five main stages provided by four operational amplifiers 132, 134, 136, and 138, together with transistor 140. Amplifier 132 is an inverting amplifier which includes an input summer and a third order filter. Amplifier 134 is an inverting amplifier. Amplifier 138 is a buffer amplifier preceded by a high-pass filter. Amplifier 136 is an inverting amplifier that also sums the third order filtered error signal at a high level, with the output signal altered by a high-pass filter at a lower level. Transistor 140 is a buffer that drives the input to the voltage comparator. The operational amplifiers are available from Precision Monolithics as part number OP-37, and the transistor is available from RCA as part number SK3931.

The design of higher order filters is described in the text "Design of continuous and digital electronic systems" by Gordon J.A. Bird published by McGraw-Hill Book Company (UK) Limited in 1980. An underdamped active filter is one in which the filter is damped sufficiently to prevent oscillation of the output following an abrupt input stimulus.

There will now be undertaken, a detailed description of the circuit illustrated in FIG. 8. Capacitor 147 is present to remove any unwanted DC component of the analog input. If the DC component is desired, then the capacitor will be eliminated. The ratio of the impedance of the feedback circuit 144, between the output of operational amplifier 132 and its inverting input, and resistor 146, determines the gain for the analog input signal. The feedback signal from the output is attenuated by resistors 148 and 150 in the frequency band of interest. At very low frequencies, such as those below five Hertz, capacitor 152 causes increased gain in the feedback signal so that it is easier to maintain a minimal DC offset. The network of resistor 148, resistor 150 and capacitor 152, in combination with the amplifier feedback circuit 144, sets the gain of the amplifier stage for the output feedback signal. The amplifier feedback signal 144 is comprised of resistors 154, 155, and 156, together with capacitors 158, 160 and 162. The use of the above described feedback circuit 144, with the operational amplifier 132, achieves a third order low-pass filter. It is critically, or less than critically damped, and preferably under-damped.

Amplifier stage 134 inverts the signal and has its gain set by input resistor 164 and feedback resistor 166. The output of the amplifier stage 134 is again inverted by operational amplifier 136 whose gain is set by input resistor 168 and feedback resistor 170.

Figure 9:
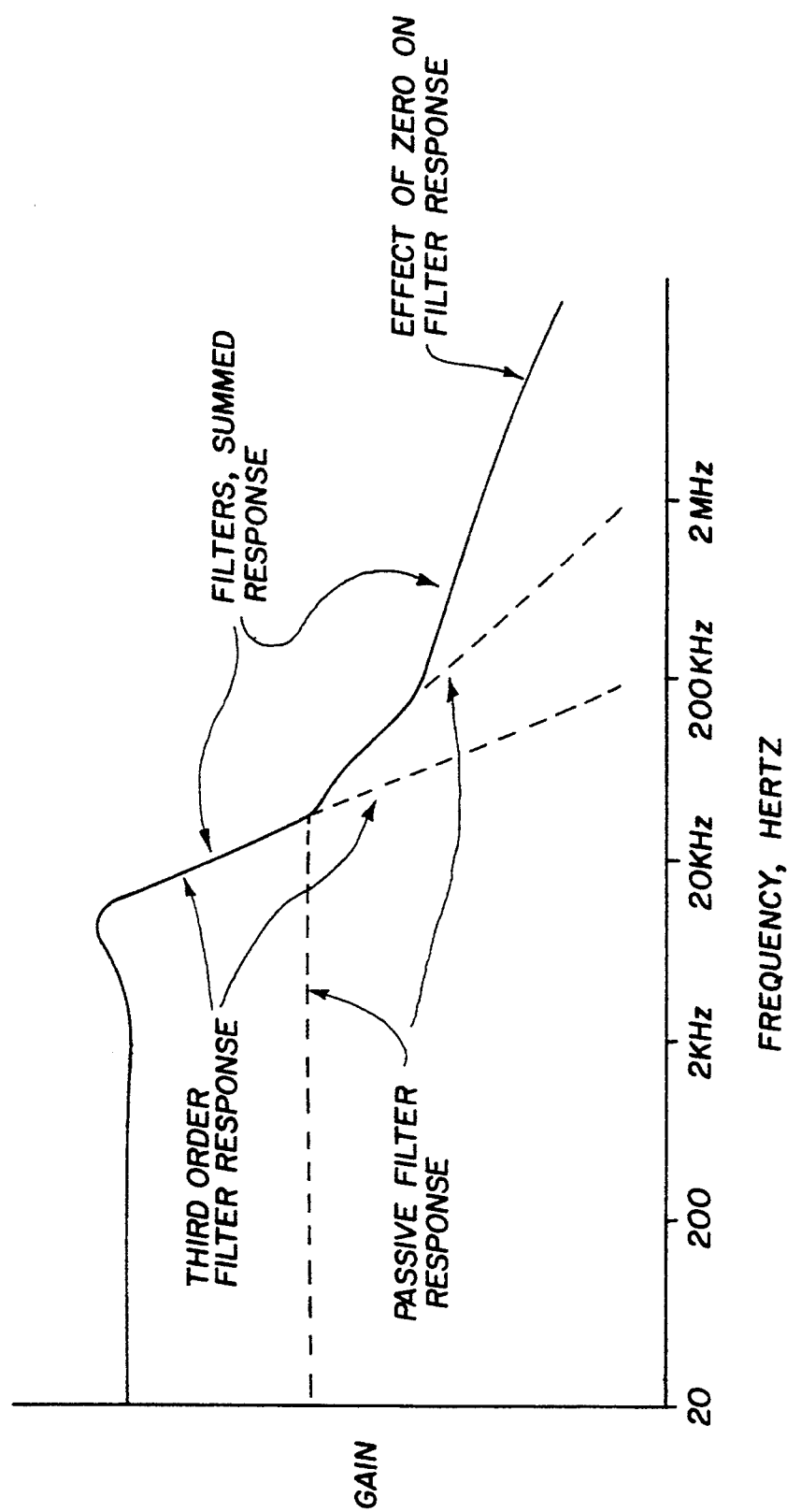
FIG. 9 is a graph illustrating the gain frequency characteristics of the passive filter response and active third order filter response.

In order to maintain stability in the closed loop system, it is necessary to reduce the slope of the response of the third order filter. The frequency response of the filter is illustrated in FIG. 9 and where there is applied a high-pass response to the output signal to create a filter zero at about 180,000 Hertz. This signal is added at a low level to the signal from the third order filter. The resulting filter response is shown by the solid line in the graph of FIG. 9. After the peaking caused by the underdamped characteristic of the filter, the filter slope decays at about 60 dB per decade until the error signal is dominated by the response of the passive filter which is a second order filter. At this higher frequency the slope changes to a 40 dB per decade slope typical of a second order filter. At an even higher frequency, the slope changes to 20 dB per decade slope typical of a first order filter. Had the third order active filter described been a fifth order filter, then the initial filter slope would have been 100 dB per decade. The higher order filter more greatly reduces the error signal outside of the band of interest and enhances the correctness of the comparator decisions made on the error signal in the band of interest. Hence, the analog output will have reduced error within the band of interest when compared to the input analog signal and will thus have improved signal-to-noise ratio and an improved linearity. The summation of a low-level representation of the analog output with the initial higher order error signal causes a reduced attenuation slope to high frequency error signals, but allows for a reduction in phase shift so that stability can be maintained. A zero or high-pass function is in series with this representation of the analog output to further reduce the phase shift to further insure stability at higher frequencies. The zero or high-pass function is achieved with resistors 172 and 174, together with capacitor 176. The output signal from the power switching network (FIG. 1) has been processed by a second order low-pass filter 32 and the high-pass filter represented by resistors 172, 174, and capacitor 176 is buffered by operational amplifier 138, whose gain is set by resistors 178 and 180. The output of the operational amplifier 138 is then summed with the third order filter output, at the inverting input of operational amplifier 136. The gain to the signal applied from operational amplifier 138 is set by the inverting amplifier 136, input resistor 182, and feedback resistor 170. The operational amplifier 136 also provides a bias voltage such that the DC error voltage at the comparator has almost no error with respect to the comparator reference voltage when the output signal has a near DC offset voltage. The bias voltage is set by resistors 184 and 186, together with Zener diode 188. The capacitor 190 filters out the power supply noise.

The voltage comparator is protected from abnormal voltage swings at its input by the diode 192 which clips the error signal if it goes too high or too low. Resistor 194 isolates the operational amplifier 136 from the excessive load that would occur if clipping occurs through the diode 192. The error signal present at the base of transistor 196 is converted from a high impedance signal to a low impedance signal by the transistor 140, together with resistor 198. The error signal is then applied to a voltage comparator, either to the one shown in FIG. 4 or the synchronous comparator shown in FIG. 7.

A number of modifications are possible. The passive low-pass filter in FIG. 6 could be eliminated entirely. It is possible to drive some loads directly with the output of the power switching network 30, where the load acts as the integrator of the switching pulses to provide a more continuous lower frequency drive to the load. However, there needs to be a filter between the output of the power switching network and the voltage comparator to improve the ability of the comparator to make decisions on the errors in the frequency band of interest. It is unnecessary to operate on the signal coming from the analog input with a filter. The analog input can be added into the circuit at any point, right up to the voltage comparator. Only the signal fed from the power switching network must be filtered before it arrives at the voltage comparator. As a matter of convenience, the analog input and the inverted reconstruction of the analog input, the output signal, are added together to create a much smaller signal representing the error, which is the difference between the two signals. By creating the error or difference signal early in the process the amplifiers can have a much lower dynamic range and increased linearity in as much as they do not need to amplify the entire signal, but just the error or coherent noise.

Figure 10:
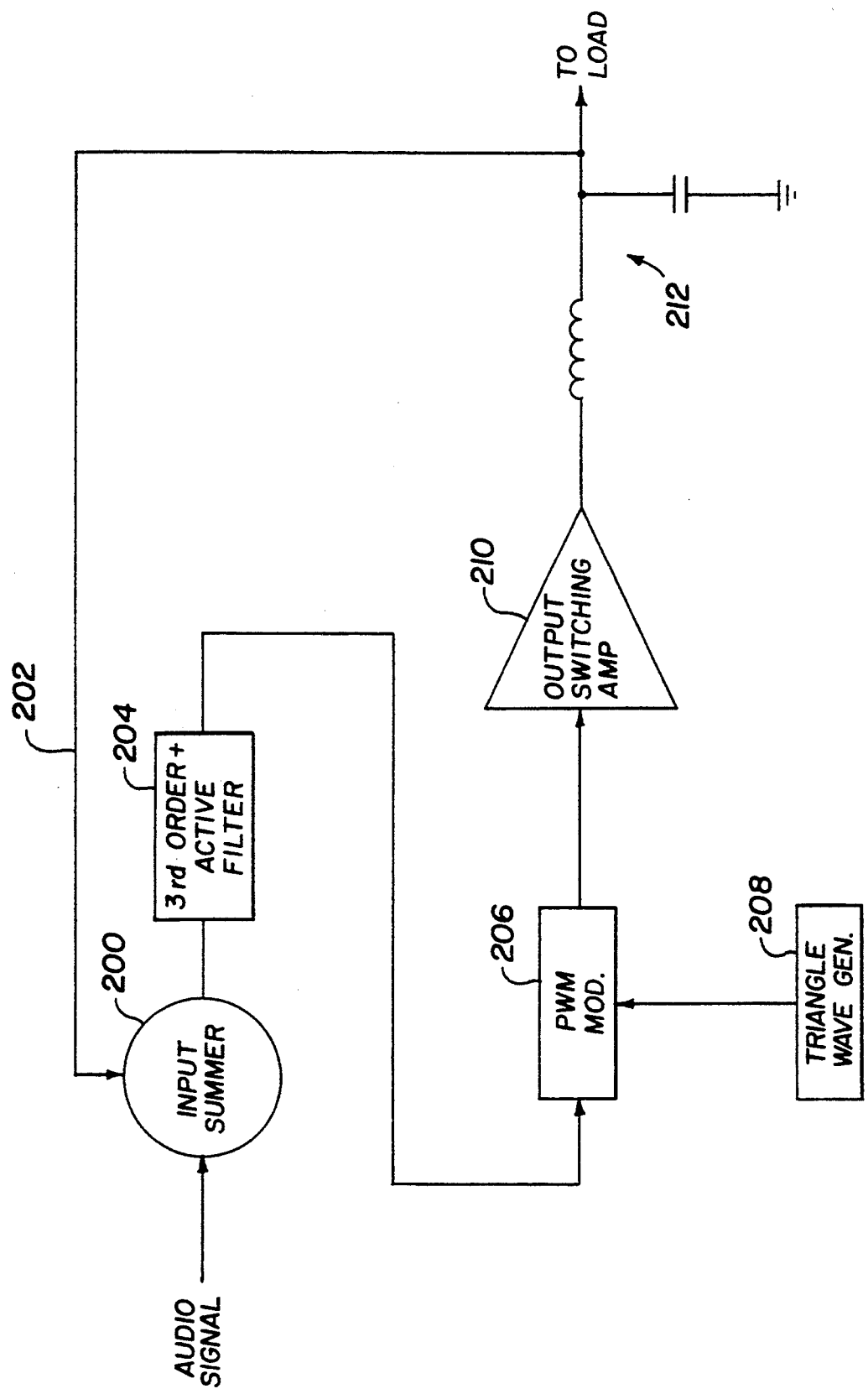
FIG. 10 is a block diagram of a power controller of the present invention, including pulse width modulation.

FIG. 10 is a schematic block diagram showing the invention applied with a pulse width modulator (PWM). An audio signal is applied to one input of input summer 200 which produces a signal which is the difference between the audio signal and a representation of that signal fed back from the output of filter 212 by way of conductor 202. The difference signal is applied to an active filter 204 of at least the third order which produces an output of high signal-to-noise ratio and linearity. The filtered signal is supplied to PWM 206. A triangle-wave carrier signal with a frequency of, for example, 430 KHz is supplied from a triangle-wave generator 208 to the PWM 206. The PWM 206 may be comprised of a level comparator and adapted to compare the level of the error or difference signal with that of the reference triangle-wave signal to generate a rectangular-wave pulse width modulated signal whose pulse width varies according to the instantaneous amplitude level and polarity of the modulating difference signal. The PWM signal is amplified by output amplifier 210. The output amplifier 210 is a switching amplifier like the power switching network 30 of FIG. 5 whose output of discrete positive and negative pulses is applied to a passive low-pass filter 212. The low-pass filter supplies to a load, such as a load speaker, an amplified, true representation of the input audio signal.

While the invention has been illustrated and described in detail in the drawing and foregoing description, the same is considered as illustrative and not restrictive in character, it being understood that only the preferred embodiments have been shown and described and that all changes and modifications that come within the spirit of the invention are desired to be protected.

What is claimed is:

1. A closed-loop system, having an input and an output, for controlling power comprising, means to sum an input signal with a derived output signal to produce a difference signal representative of the polarity of the difference between said input signal and said derived output signal, means for producing an asynchronous digital signal representative of the polarity of said difference signal, at least two switching networks, said switching networks having high energy outputs and being responsive to said asynchronous digital signal to reduce the level of said difference signal in a frequency band of interest at said means of producing the said asynchronous digital signal; and a low-pass filter at least of the third order between said high energy outputs and said means of producing the said asynchronous digital signal to attenuate high-frequency noise, said low-pass filter being in said closed loop to enhance the signal-to-noise ratio at said output of said closed-loop system and modified to maintain loop stability.

2. A closed-loop system, having an input and an analog output, for controlling power comprising, means to sum a signal applied to the input with a signal derived from the analog output to produce a difference signal representative of the polarity of the difference between said input signal and said derived output signal, means for producing a digital signal representative of the polarity of said difference signal, at least two switching networks, said switching networks having high energy outputs and being responsive to said digital signals, to reduce the level of said difference signal in the frequency band of interest at the means for producing the said digital signals, a low-pass filter between said high energy outputs and the said analog output to attenuate high-frequency noise, and a low-pass filter at least of the third order in said closed loop to enhance the signal-to-noise ratio at said output of said closed-loop system, said low-pass filter at least of the third order modified to maintain loop stability.

3. A closed-loop system as set forth in claim 2 or 1 in which said switching networks are responsive to said digital signal synchronous with a clock producing pulses at a rate significantly higher than the frequencies of the input signal.

4. A closed-loop system as set forth in claim 1 wherein said low-pass filter is underdamped.

5. A closed-loop system as set forth in claim 2 wherein said low-pass filter in the closed-loop is underdamped.

6. A closed-loop system, having an input and an output, for controlling power comprising, means to sum a signal applied to the input with a signal derived from the output to produce a difference signal, means for generating a reference signal, comparison means for comparing said difference signal with said reference signal to produce a digital signal representative of the polarity difference between said difference signal and said reference signal, at least two switching networks, said switching networks having high energy outputs representative of said digital signal, to reduce the level of said difference signal in the frequency band of interest at the means for producing the said digital signal, a low-pass filter between said high energy outputs and said means for producing the said digital signal to attenuate high-frequency noise, and a low-pass filter of at least the third order in the closed loop to enhance the signal-to-noise ratio and modified to maintain loop stability.

7. A closed-loop system as set forth in claim 6 in which said low-pass filter of at least the third order is underdamped.

8. A closed-loop system as set forth in claim 6 or 7 wherein the closed-loop system includes a pulse-width modulator.

9. A closed-loop system as set forth in claim 6 or 7, wherein said low-pass filter of at least the third order has more than 180 degrees of phase lag at certain frequencies.

10. A closed-loop system as set forth in claim 1, 2, 3, 4 or 5 wherein said low-pass filter of at least the third order has more than 180 degrees of phase lag at certain frequencies.

11. A closed-loop system as set forth in claim 8 wherein said low-pass filter of at least the third order has more than 180 degrees of phase lag at certain frequencies.

12. A closed-loop system as set forth in claim 10 including means for reducing the phase lag below 180 degrees.

13. A closed-loop system as set forth in claim 11 including means for reducing the phase lag below 180 degrees.

14. A closed-loop system as set forth in claim 9 including means for reducing the phase lag below 180 degrees.

15. A closed-loop system as set forth in claim 1, 2, 3, 4, 5, 6, or 7, wherein the closed loop system is a power amplifier and the input signal is in the audio frequency range.

16. A closed-loop system as set forth in claim 8 wherein the closed-loop system is a power amplifier and the input signal is in the audio frequency range.

17. A closed-loop system as set forth in claim 9 wherein the closed-loop system is a power amplifier and the input signal is in the audio frequency range.

18. A closed-loop system as set forth in claim 14 wherein the closed-loop system is a power amplifier and the input signal is in the audio frequency range.

19. A closed-loop system as set forth in claim 10 wherein the closed-loop system is a power amplifier and the input signal is in the audio frequency range.

20. A closed-loop system as set forth in claim 12 wherein the closed-loop system is a power amplifier and the input signal is in the audio frequency range.

21. A closed-loop system as set forth in claim 12 wherein the closed-loop system is a power amplifier and the input signal is in the audio frequency range.

22. A closed-loop system as set forth in claim 13 wherein the closed-loop system is a power amplifier and the input signal is in the audio frequency range.

* * * * *